United States Patent [19]

Maxwell

[11] Patent Number: 4,571,354

[45] Date of Patent: Feb. 18, 1986

[54] TAPE AUTOMATED BONDING OF INTEGRATED CIRCUITS

[75] Inventor: Michael J. Maxwell, Tempe, Ariz.

[73] Assignee: Rogers Corporation, Rogers, Conn.

[21] Appl. No.: 565,463

[22] Filed: Dec. 27, 1983

[51] Int. Cl.⁴ .............................................. B32B 3/10
[52] U.S. Cl. ..................................... 428/78; 156/253; 357/80; 428/209
[58] Field of Search .................. 428/13, 209, 137, 78; 357/70, 80; 156/253

[56] References Cited

U.S. PATENT DOCUMENTS

| | | |
|---|---|---|
| 4,007,479 | 2/1977 | Kowalski ............................ 357/70 |
| 4,195,195 | 3/1980 | de Miranda et al. ............. 174/68.5 |
| 4,390,598 | 6/1983 | Phy ....................................... 428/577 |
| 4,407,872 | 10/1983 | Horii ..................................... 428/209 |
| 4,459,607 | 7/1984 | Reid ......................................... 357/80 |
| 4,472,762 | 9/1984 | Spinelli et al. ..................... 174/68.5 |

Primary Examiner—Jay H. Woo
Assistant Examiner—Timothy W. Heitbrink
Attorney, Agent, or Firm—Fishman & Dionne

[57] ABSTRACT

A method and apparatus are presented for tape automated bonding of integrated circuits wherein a support ring is formed in the feature window to provide reinforcement for unsupported interconnection leads between the inner and outer lead bond sites.

4 Claims, 14 Drawing Figures

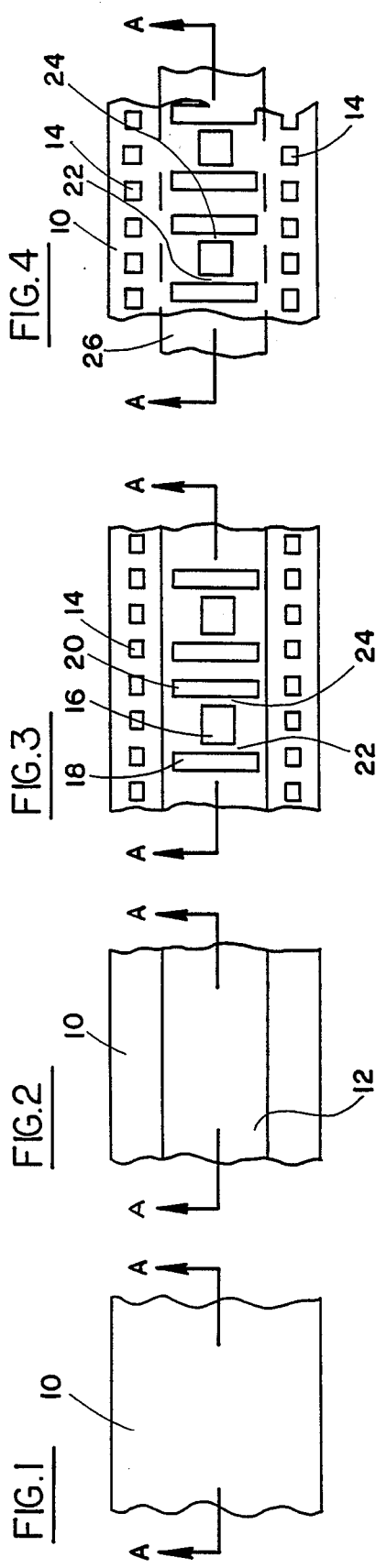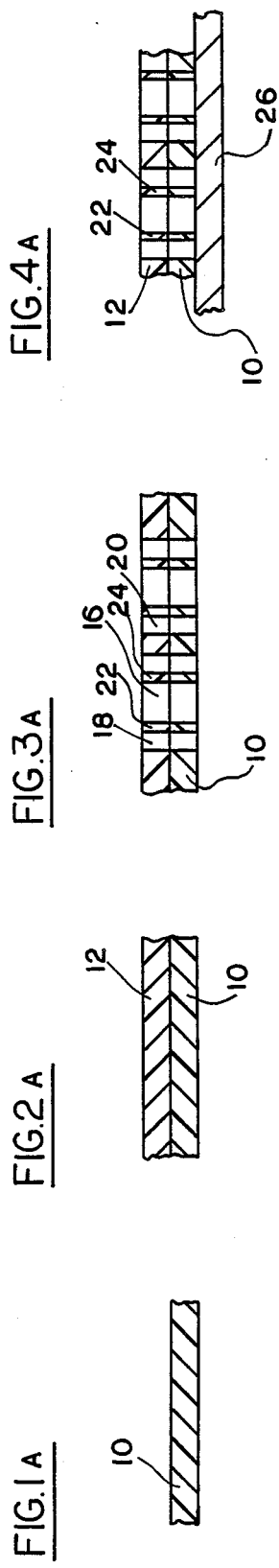

TAPE AUTOMATED BONDING OF INTEGRATED CIRCUITS

BACKGROUND OF THE INVENTION

This invention relates to a method for and apparatus for tape automated bonding (TAB) for integrated circuits (ICs). More particularly, this invention relates to a method for producing three layer conductive foil, adhesive and polymer film TAB substrates with a support ring in the feature window; and this invention also relates to the structure of a three layer TAB substrate with a support ring in the feature window.

The general process of tape automated bonding for integrated circuits is known in the art. The TAB process requires the production and use of a substrate having a feature window into which the integrated circuit is placed for connection to circuitry.

In current standard practice there are two commonly used methods for making three layer TAB substrates. One method consists of the following steps:
(1) slit the insulating material to desired width;
(2) laminate adhesive to one side of the insulating film the adhesive width being less than the width of the insulating material;
(3) punch sprocket holes along the side boundaries of the film strip and punch feature windows aligned along the center axis of the film strip;
(4) laminate copper foil to the adhesive coated side of the film strip and cure to bond.

The second method consists of the following steps:
(1) coat on insulating material (prior to slitting to width) full width with an adhesive originally in the form of a wet film;
(2) slit the material of (1) to desired width;
(3) punch sprocket holes along the side boundaries of the film strip and punch feature windows aligned along the center axis of the film strip;
(4) laminate copper foil to the adhesive coated side of the film strip and cure to bond.

Subsequent to these steps for preparing the TAB substrate, desired circuit patterns with interconnect leads will be printed in the copper foil, and an integrated circuit will be positioned in the feature window and connected to lead lines of the circuitry.

A significant problem exists in the prior art in that the lead lines between the circuitry and the IC are unsupported in the area of the feature window. This makes it very difficult to achieve and maintain desired alignment between lead lines and bond sites on the IC, especialy in view of the dimensions involved in IC technology and both the narrow width of both the lead lines and the narrow spacing between the lead lines.

SUMMARY OF THE INVENTION

The above discussed and other problems of the prior art are overcome or reduced by the process and structure of the present invention. In accordance with the present invention, the three layer TAB substrate is formed with a support ring in the feature window. This support ring provides reinforcement for the previously unsupported interconnection leads between the circuitry and the inner and outer lead bond sites.

In accordance with the present invention, the support ring is formed by additional processing steps which include both multiple steps for the formation of the feature window and the use of a temporary carrier film or support substrate. In accordance with the present invention, the feature window is partially formed in a first step; the temporary support substrate is adhered to the insulating film on the side opposite that to which the copper foil is to be attached; the remainder of the feature window is then formed with the support ring in the feature window, the support ring being temporarily supported on the temporary carrier film; the copper foil is then laminated to the insulating base film; and the temporary carrier film is then removed leaving the support ring in position within the feature window and bonded to the copper foil.

The process of the present invention and the resulting TAB substrate configuration eliminate the problem of the prior art by providing a support structure in the feature window to support the interconnection leads to the IC. The foil of the interconnection leads, after etching, is bonded to and supported by the support ring. Thus, the support ring not only provides physical support for the interconnection leads, but it also aligns and registers the interconnection leads by fixing the positions of the leads and maintaining the separation space between the leads.

The above discussed and other features and advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES:

FIGS. 1-7 show plan views of various stages in the manufacturing process for forming TAB substrates in accordance with the present invention.

FIGS. 1A-7A are sectional elevation views taken, respectively, along lines A—A of each of FIGS. 1-7.

DESCRIPTION OF THE PREFERRED EMBODIMENT

Figure 5:
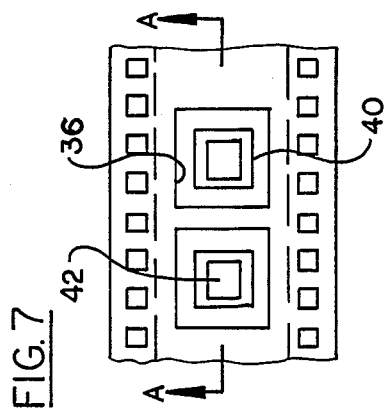

Referring first to FIGS. 1 and 1A, a film of insulating material (preferably DuPont's Kapton polyester film or other polymer film) is slit to desired width to form a base film 10. Film 10 is slit to 35 millimeter or other appropriate width (the dimension seen in plan in FIG. 1) and has a thickness in the range of 0.002-0.005 inch (the dimension seen in elevation section in FIG. 1A). Film 10 is then coated with a layer of heat curable adhesive 12 of about 0.001 inch thick, as seen in FIGS. 2 and 2A. At this stage, the adhesive is not cured. In this embodiment, the span of adhesive 12 is narrower than the width of base film 10, thus leaving border or edge areas.

Referring next to FIGS. 3 and 3A, in the next step of manufacturing, a punching operation is performed to punch out sprocket holes 14 in the edge or border areas of film 10 which are thereafter used for alignment, registration and advancement of the base film and further processing. Also in this third step, a punching process is carried out to form a first or preliminary stage of the feature window for the TAB substrate, which may be considered a preform for the feature window. In this punching step, a square opening 16 and rectangular openings 18 and 20 are formed in base strip 10 and adhesive layer 12. As shown in the drawings, square opening 16 and rectangular openings 18 and 20 are symmetrical about the center axis of base sheet 10, with rectangular openings 18 and 20 extending beyond the sides of square opening 16 as shown in FIG. 3. However, depending on the requirements of a particular application, those openings may be other than symmetrical and may be off center with respect to the center axis of the base strips. The punching is performed so that webs 22 and 24 remain between openings 16 and openings 18 and 20, respectively. The punching process wherein the feature window preforms are punched is carried out repeatedly so that a succession of these preforms is formed as the base film is advanced in the course of the manufacturing process.

In the next step of the manufacturing process, indicated at FIGS. 4 and 4A, a pressure sensitive adhesive tape 26 is applied to base sheet 10 on the side thereof opposite to adhesive layer 12. The width of tape 26 is approximately equal to the span of adhesive 12 between the uncoated areas of film 10 in which sprockets 14 are formed; and it will be noted that both the span of adhesive 12 and the span of tape 26 extends beyond the widthwise dimensions of openings 18 and 20.

Figure 5A:
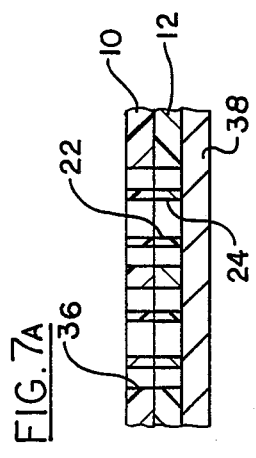

Referring now to FIGS. 5 and 5A, the next step in the manufacturing process is shown wherein the material between the ends of rectangular openings 18 and 20 is punched out to form connecting openings 28 and 30. However, this punching is carried out to leave another pair of connecting webs 32 and 34 connected to and running between webs 22 and 24. Thus, as can best be seen in FIG. 5, a square ring of base material, made up of webs 22, 24, 32 and 34 is formed. This square ring is supported on pressure sensitive adhesive tape 26 and it is centered within the opening of what is now the completed feature window 36.

Figure 6:
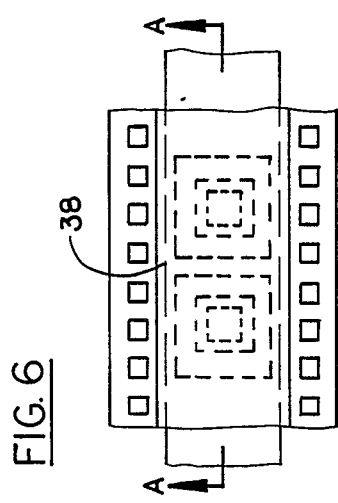
Figure 6A:
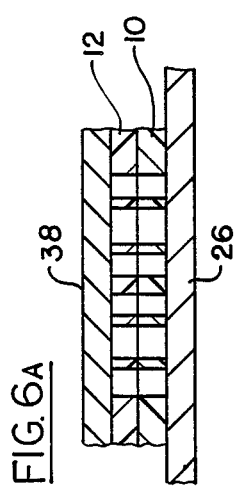

Referring next to FIGS. 6 and 6A, in the next step of the manufacturing process a conductive foil 38, such as copper of approximately 0.001 inch thickness, is laminated to the adhesive 12 on the upper surface of base film 10 and to the square ring of webs 22, 24, 32, 34. The laminated assembly is then passed through a heat curing stage to cure the adhesive and bond the conductive foil 38 to base film 10 and to the square ring of webs 22, 24, 32, 34.

Figure 7:
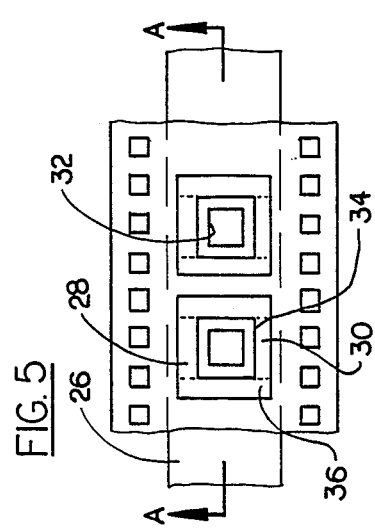
Figure 7A:
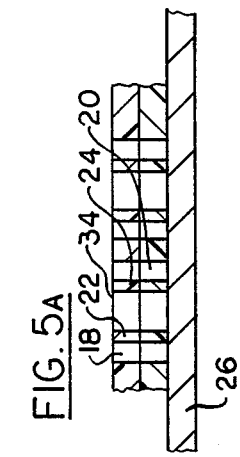

In the final manufacturing step, as seen in FIGS. 7 and 7A, pressure sensitive adhesive layer 26 is removed leaving the final TAB substrate. In this final TAB substrate, the foil 38 and base film 10 are bonded together; and the square ring made up of webs 22, 24, 32 and 34 is also bonded to foil 38. Thus, the final assembly has a square ring 40 of insulating material positioned centrally within feature window 36; and square ring 40 defines a square central opening 42 which is sized and adapted to receive an integrated circuit during future assembly operations.

In future assembly operations, the conductive foil 38 will be etched to form circuit patterns and leads; and these leads will cross over the sides of ring 40 and will be connected to an integrated circuit placed in opening 42. Since the conductive leads will be foil material remaining after printed circuit etching or similar processing, the conductive leads will be bonded to and supported by ring 40 at the crossoever points. Thus, in accordance with the present invention, the ring 40 provides physical support for the conductive leads to the IC, as well as assuring alignment between the leads and the lead bond sites on the integrated circuit and assuring integrity of spacing between adjacent leads.

As an alternative, the steps of FIGS. 1, 1A, 2, 2A could be modified whereby the adhesive is cast on the insulating base prior to slitting, and the material (i.e., insulating base and adhesive) is then cut to desired widths to produce strips where the adhesive is the full width of the insulating material.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A substrate for tape automated bonding of electronic components, the substrate having:
    a layer of insulating material;
    a layer of adhesive material on a first surface of said insulating material;
    a layer of electrically conductive material on said adhesive layer and bonded by said adhesive layer to said insulating material;
    a feature window in said layer of insulating material; and
    a support ring in said feature window, said support ring being bonded to said layer of electrically conductive material.

2. The substrate of claim 1 wherein:
    said support ring and said feature window are formed by selective removal of material from said insulating material.

3. The substrate of claim 2 wherein:
    said support ring is supported on a temporary support after formation of the support ring and prior to bonding said support ring to said layer of electrically conductive material.

4. The substrate of claim 1 and further including:
    electronic component means within said support ring; and
    circuit lead means defined in said layer of electrically conductive material, said lead means being supported by said support ring and being connected to said electronic component means.

* * * * *